US010719331B2

United States Patent
Froidevaux et al.

(10) Patent No.: US 10,719,331 B2
(45) Date of Patent: Jul. 21, 2020

(54) STAND-BY MODE OF AN ELECTRONIC CIRCUIT

(71) Applicant: STMicroelectronics (Rousset) SAS, Rousset (FR)

(72) Inventors: Nicolas Froidevaux, Aix en Provence (FR); Jean-Michel Gril-Maffre, Aix-en-Provence (FR); Jean-Pierre Leca, Aix-en-Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 203 days.

(21) Appl. No.: 16/026,233

(22) Filed: Jul. 3, 2018

(65) Prior Publication Data

US 2018/0329721 A1    Nov. 15, 2018

Related U.S. Application Data

(63) Continuation of application No. 15/153,118, filed on May 12, 2016, now abandoned.

(30) Foreign Application Priority Data

Nov. 20, 2015 (FR) ..................... 15 61202

(51) Int. Cl.
| | | |
|---|---|---|
| G06F 1/24 | (2006.01) | |
| G06F 9/4401 | (2018.01) | |
| G06F 1/28 | (2006.01) | |
| G06F 1/32 | (2019.01) | |
| G06F 1/3203 | (2019.01) | |

(Continued)

(52) U.S. Cl.
CPC .............. *G06F 9/4418* (2013.01); *G06F 1/24* (2013.01); *G06F 1/28* (2013.01); *G06F 1/32* (2013.01); *G06F 1/3203* (2013.01); *G06F 1/3296* (2013.01); *G06F 9/442* (2013.01); *G06F 9/4403* (2013.01); *H03K 19/0016* (2013.01)

(58) Field of Classification Search
CPC ........................................................ G06F 1/24
See application file for complete search history.

(56) References Cited

U.S. PATENT DOCUMENTS

| | | | | |
|---|---|---|---|---|
| 5,675,272 A | * | 10/1997 | Chu ................. | G01R 19/16528 327/142 |
| 8,415,993 B1 | * | 4/2013 | Newman ................... | H03L 5/00 327/142 |
| 2005/0034016 A1 | | 2/2005 | Ferrand et al. | |

(Continued)

FOREIGN PATENT DOCUMENTS

| | | |
|---|---|---|
| EP | 0537525 A2 | 4/1993 |
| EP | 0746817 B1 | 7/2000 |
| EP | 1102158 A1 | 5/2001 |

OTHER PUBLICATIONS

INPI Search Report and Written Opinion for FR 1561202 dated Jul. 15, 2016 (8 pages).

*Primary Examiner* — Kim Huynh
*Assistant Examiner* — Eric Chang
(74) *Attorney, Agent, or Firm* — Crowe & Dunlevy

(57) ABSTRACT

A microcontroller includes a core and a unit for managing the power supply of the core that includes an input for receiving an external signal indicating a leaving of a stand-by mode of operation. A signal intercepting unit intercepts the external signal and transmitting it with a delay to the unit for managing.

16 Claims, 2 Drawing Sheets

(51) Int. Cl.
*G06F 1/3296* (2019.01)
*H03K 19/00* (2006.01)

(56) References Cited

U.S. PATENT DOCUMENTS

| | | |
|---|---|---|
| 2010/0064160 A1 | 3/2010 | Wilson et al. |
| 2014/0089708 A1 | 3/2014 | Menard et al. |
| 2016/0056811 A1* | 2/2016 | Wadhwa .............. H03K 17/223 |
| | | 327/143 |

* cited by examiner

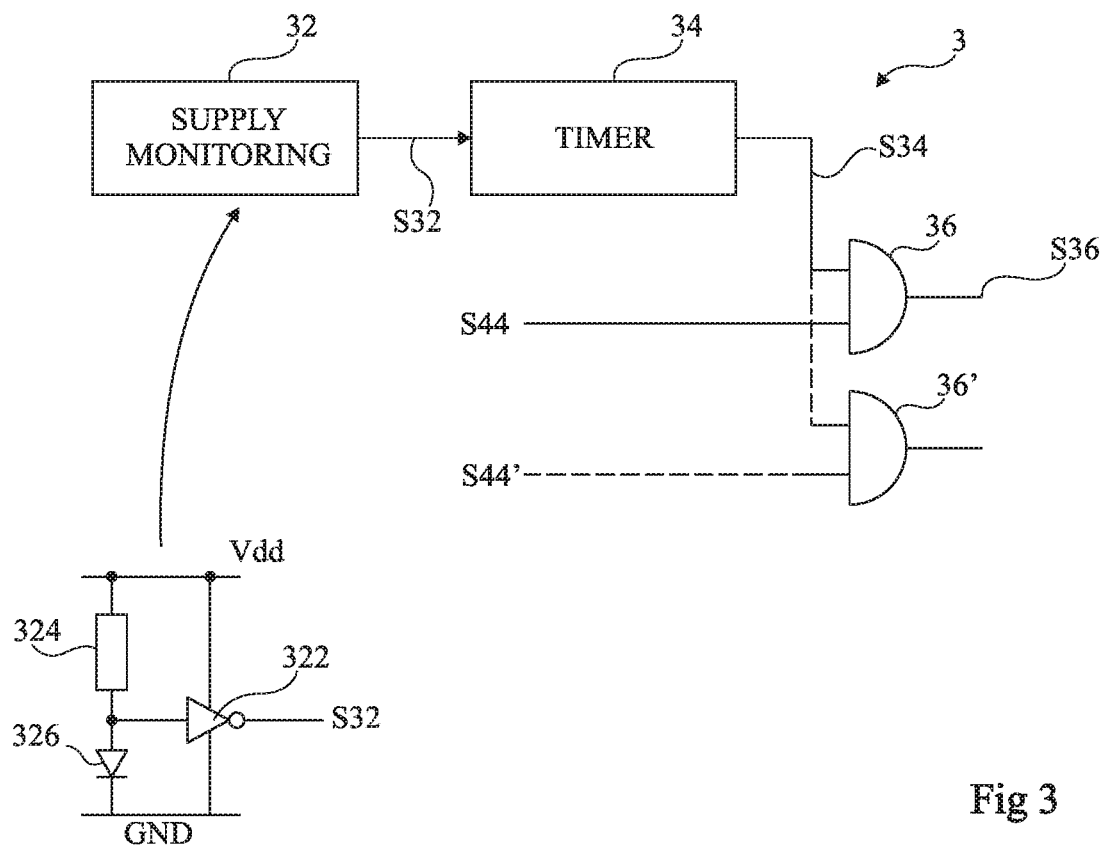
Fig 3
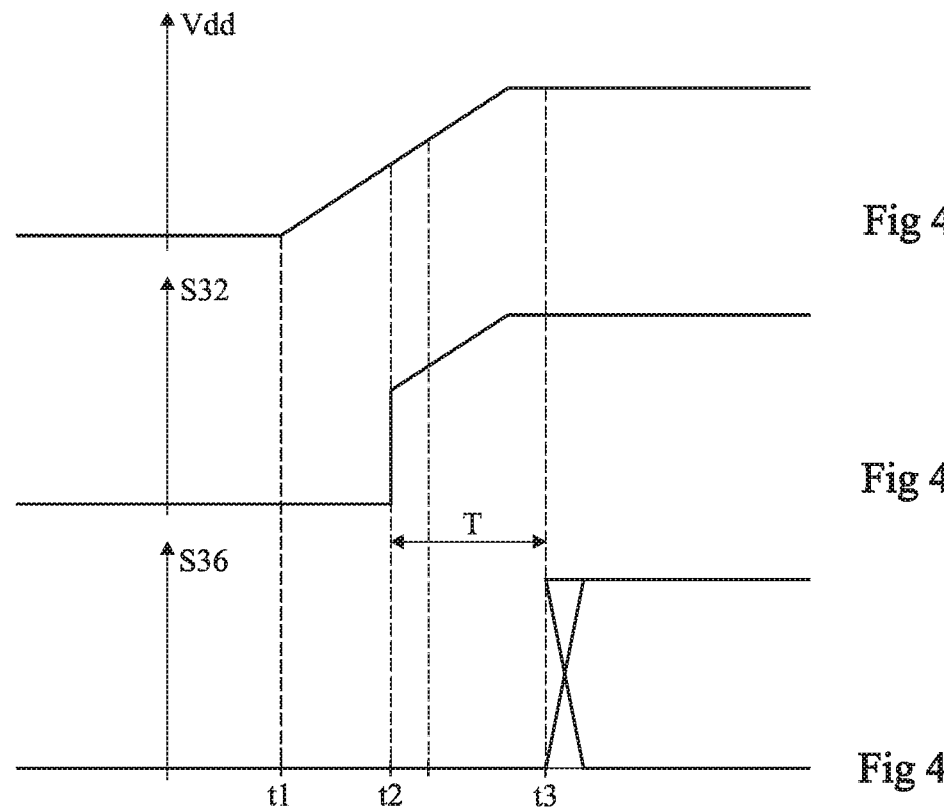
Fig 4A
Fig 4B
Fig 4C

STAND-BY MODE OF AN ELECTRONIC CIRCUIT

CROSS REFERENCE TO RELATED APPLICATIONS

This application is a continuation of U.S. patent application Ser. No. 15/153,118, filed May 12, 2016 (now abandoned), which claims the priority benefit of French Application for Patent No. 1561202, filed on Nov. 20, 2015, the disclosures of which are hereby incorporated by reference in their entireties to the maximum extent allowable by law.

TECHNICAL FIELD

The present disclosure generally relates to electronic circuits and, more specifically, to the stand-by mode of a microcontroller.

BACKGROUND

In many applications, the electric power consumption of an electronic circuit is desired to be minimized when the electronic circuit is not used. Stand-by mechanisms, which enable to decrease the circuit power consumption, are thus provided.

In electronic circuits comprising a microcontroller, the microcontroller generally integrates stand-by functions enabling to set its core to stand-by mode during periods when it is not used. During such stand-by periods, other circuits of the microcontroller monitor the microcontroller inputs-outputs to detect a need to wake the core.

SUMMARY

It would be desirable to decrease the residual power consumption of a microcontroller, including during stand-by periods.

An embodiment overcomes all or part of the disadvantages of usual circuits for setting a microcontroller to stand-by mode.

An embodiment provides a solution which is easy to implement.

Thus, an embodiment provides a microcontroller comprising: a core; a circuit for managing the core power supply, comprising at least one input for receiving an external signal for leaving a stand-by mode; and a signal intercepting circuit configured to intercept said external signal and transmit it with a delay to said circuit for managing.

According to an embodiment, said circuit for managing comprises a logic function for storing said input signal.

According to an embodiment, said logic function is reset by the circuit for managing at the end of said delay.

According to an embodiment, said signal intercepting circuit receives the output of said logic function and combines it with data representative of the power supply voltage of the microcontroller.

According to an embodiment, said signal intercepting circuit triggers an interruption when the level of the power supply voltage reaches a threshold.

BRIEF DESCRIPTION OF THE DRAWINGS

The foregoing and other features and advantages will be discussed in detail in the following non-limiting description of specific embodiments in connection with the accompanying drawings, wherein:

FIG. 3 is a block diagram showing an embodiment of a circuit for waking the microcontroller; and FIGS. 4A, 4B, and 4C illustrate, in the form of timing diagrams, the operation of the circuit of FIG. 3.

DETAILED DESCRIPTION

Figure 1:
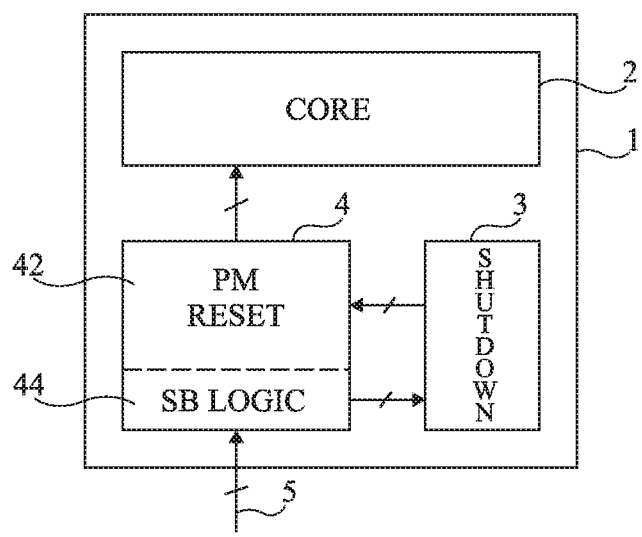
FIG. 1 schematically shows an embodiment of a microcontroller.

The same elements have been designated with the same reference numerals in the different drawings. In particular, the structural and/or functional elements common to the different embodiments may be designated with the same reference numerals and may have identical structural, dimensional, and material properties. For clarity, only those steps and elements which are useful to the understanding of the described embodiments have been shown and will be detailed. In particular, the elements present in the microcontroller having its setting to stand-by mode controlled have not been detailed, the described embodiments being compatible with usual applications. When reference is made to terms "about", "approximately", or "in the order of", this means to within 10%, preferably to within 5%.

FIG. 1 schematically shows an embodiment of a microcontroller 1. In the example shown in FIG. 1, the microcontroller comprises a core 2 (CORE) and a circuit 4 for restarting or resetting the power supply of the core 2.

For simplification, not all the circuits internal to microcontroller 1 have been shown. Only the circuits involved in the setting to stand-by mode and the waking from stand-by mode have been shown. In particular, the microcontroller 1 comprises volatile and non-volatile storage elements and various coprocessors and input-output circuits, which have not been illustrated. Further, the circuit restarting function is considered since, as will be seen hereafter, this function may be a problem. However, circuit 4 generally also comprises other power supply control functions.

In a usual solution, on setting to stand-by mode, the power supply of core 2 of the microcontroller is stopped. However, the equivalent of circuit 4 in the usual solution remains powered to be able to detect a need for a restart (wake from standby) by interpreting inputs-outputs 5 of the microcontroller.

The described embodiments herein result from a new analysis of the needs of a microcontroller, considering that certain applications do not need a monitoring of their power supply.

Based on this analysis, the power supply monitoring block can then be turned off. However, one of the reasons for which the power supply monitoring block 4 is generally never turned off is that one must be able to detect a restart due to a drop followed by a rise of the power supply voltage. In usual solutions, if power supply monitoring block 4 is turned off, the system cannot be correctly woken to restart the microcontroller. In particular, certain logic circuits then take undetermined states when the power supply rises. The starting of the power supply detection block can then be prevented by such undetermined states. The consequence of adding this ability to stop the power supply monitoring block would then be to make the starting of the microcontroller unpredictable (impossible starting according to the undetermined state).

It is provided to add to the microcontroller and, more particularly, to its block for resetting power supply monitoring circuit 4, a stop/start circuit 3 (SHUTDOWN).

To achieve this, in circuit 4, a function 42 (PM RESET) of restarting or resetting the power supply (Power Management), and thus the system, and a logic function 44 (SB LOGIC) of detecting the stopping/starting of function 42, are distinguished.

The two functions 42 and 44 of circuit 4 communicate separately with unit 3. Only function 42 communicates with core 2 to wake it up. Function 44 intercepts a wake-up request coming from outside of microcontroller 2 and, instead of transmitting it to circuit 42, transmits it to unit 3 which provides the signal for controlling the resetting or restarting of the power supply of circuit 4 which manages the power supply of the rest of the product (microcontroller).

Thus, during stand-by periods, only logic block 44 and unit 3 remain active, which considerably decreases the power consumption as the core and function 44 are inactive.

Figure 2:
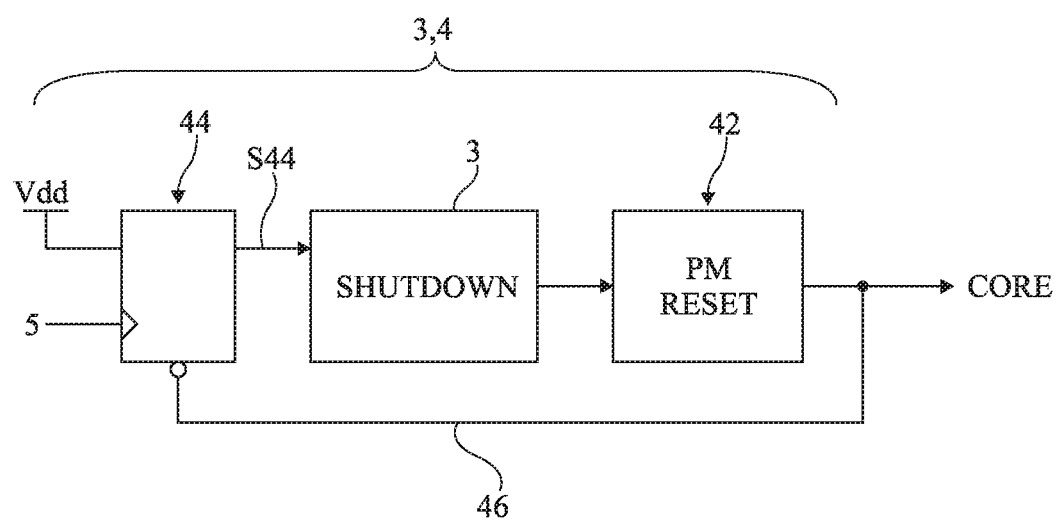
FIG. 2 is a block diagram showing an embodiment of a circuit for setting the microcontroller to stand-by mode.

FIG. 2 schematically shows an embodiment of an interconnection between functions 42, 44, and 3, highlighting the interception of the logic signal for resetting block 42 by unit 3.

In this example, logic function 44 is carried out, for each external resource capable of waking up the microcontroller, by a flip-flop having a clock input, for example, active on a rising edge, receiving (inputs 5) microcontroller reactivation data (for leaving the stand-by state). Output S44 of this flip-flop is processed by unit 3 having an output activating the reset (the reactivation) of the power supply by block 42. Once block 42 has restarted, core 2 is active again. A function of circuit 3 is to interrupt the output signal of flip-flop 44 to avoid for the activation of a reset of circuit 42 to cause a reset of the flip-flop (connection 46 between the output of block 42 and the reset input of the flip-flop).

The number of flip-flops 44 depends on the number of possible waking inputs 5 of microcontroller 1.

In practice, unit 3 only interrupts the reset signal according to the state of the power supply. In other words, circuit 3 does not modify the reset signal if the power supply is active but delays it on waking up.

FIG. 3 is a simplified block diagram of an embodiment of unit 3.

According to this embodiment, unit 3 comprises a circuit 32 (SUPPLY MONITORING) for detecting power supply voltage Vdd of the microcontroller, which thus detects whether power supply function 42 is active or not. As a specific embodiment, detector 32 comprises a logic inverter 322 powered with voltage Vdd (rails Vdd and GND) applied to the microcontroller and having its input connected to the junction point of a resistor 324 and of a diode 326. The value of resistance 324 sets the switching threshold of inverter 322.

Result S32 of the detection crosses a timer 34 (TIMER) before being applied to a first input of an AND-type logic gate 36. The second input of gate 36 receives output signal S44 of flip-flop 44.

In the case of a plurality of inputs 5, and thus of flip-flops 44, each flip-flop is associated with a logic gate (in the shown example, a second gate 36') having a first input receiving the output of timer 34 and having a second input receiving the output (for example, S44') of the concerned flip-flop.

In practice, circuit 42 also includes a function of monitoring power supply Vdd. However, this function should be accurate for the operation of microcontroller 1, which implies a significant power consumption. The detection performed by unit 3 having as only function to mask the state of the start control signal, which may be undetermined at a very low voltage or at the beginning of the powering up, does not need such an accuracy and may be very simple (and with a low power consumption), as illustrated in FIG. 3.

FIGS. 4A, 4B, and 4C illustrate in timing diagrams the operation of the circuit of FIG. 3. FIG. 4A shows an example of variation of voltage Vdd on waking up. FIG. 4B shows the corresponding shape of signal S32. FIG. 4C shows the corresponding shape of output signal S36 of gate 36.

An initial state where voltage Vdd is zero, that is, where the power supply is stopped (microcontroller at stand-by) is assumed.

At a time t1, voltage Vdd starts increasing, under the effect of a waking of the system (switching of signal 5, FIG. 2). When voltage Vdd reaches (time t2) the threshold set by resistor 324 and diode 326, output S32 of inverter 322 copies the value of voltage Vdd. Delay T set by circuit 34 results in that at a subsequent time t3, output S36 of gate 36 switches to the high state. Indeed, the output of flip-flop 44 is in the high state since signal 5 has switched.

Delay T is selected so that the level of voltage Vdd at the end of time T is higher than the triggering threshold of the reset input of circuit 42. Thus, at the end of delay T, when the signal is output by circuit 34, voltage Vdd is sufficient for circuit 42 to be immediately activated. The starting of microcontroller power supply management circuit 42 thus occurs correctly. Once the voltage is restored by circuit 42, flip-flop 44 is reset (FIG. 2) and is thus ready to be subsequently restarted.

An advantage of the described embodiments is that they solve the possible problem of an unknown output state of flip-flop(s) 44 when the system is woken.

It is now possible to set power supply block 4 (except for logic function 44) to stand-by mode and to wake it when necessary.

Another advantage is that the process of setting to stand-by mode (turning off) need not, in most cases, be modified. Indeed, the reset system just needs to have a start/stop control, which is in practice almost always true.

Another advantage of the described embodiments is that they only introduce a low residual power consumption.

Various embodiments have been described. Various alterations, modifications, and improvements will occur to those skilled in the art. In particular, the number of inputs processed by circuit 3 depends on the number of microcontroller waking inputs 5. Further, the selection of the detection thresholds also depends on the application. Finally, the practical implementation of the embodiments which have been described is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A circuit, comprising:
a flip-flop having an input configured to receive an input signal, a clock input configured to receive a wake-up signal, a reset input, and a data output;
a shutdown circuit including a logic circuit configured to logically combine a signal generated at the data output of the flip-flop with a first control signal indicating that a voltage of a power supply is sufficient; and
a power management reset circuit having an input configured to receive a second control signal output by the logic circuit, the power management reset circuit configured to generate a reset signal in response to the second control signal;

wherein the reset signal is further applied to the reset input of the flip-flop.

2. The circuit of claim 1, further comprising a microcontroller core having a reset controlled by the reset signal.

3. The circuit of claim 2, wherein the microcontroller core and power management reset circuit are not active in a stand-by mode of operation in order to save power and wherein the wake-up signal is asserted to wake the microcontroller core from the stand-by mode of operation.

4. The circuit of claim 3, wherein the flip-flop and shutdown circuit remain active during the stand-by mode of operation.

5. The circuit of claim 3, wherein the microcontroller core, the flip-flop, shutdown circuit and power management reset circuit are components of a microcontroller circuit.

6. The circuit of claim 3, wherein the power management reset circuit is further configured to generate the reset signal in response to monitoring of a microcontroller core power supply voltage.

7. The circuit of claim 1, wherein the power management reset circuit is not active in a stand-by mode of operation in order to save power and wherein the flip-flop and shutdown circuit remain active during the stand-by mode of operation.

8. The circuit of claim 1, wherein the logic circuit of the shutdown circuit comprises:
a logic gate having a first input configured to receive the first control signal and having a second input configured to receive the signal generated at the data output of the flip-flop.

9. The circuit of claim 8, wherein the logic gate is an AND gate.

10. The circuit of claim 8, wherein the logic circuit of the shutdown circuit further comprises:
a supply monitoring circuit configured to monitor a power supply voltage and generate a second control signal when the monitored power supply voltage exceeds a threshold voltage; and
a timing circuit configured to generate the first control signal from a time delay of the second control signal.

11. The circuit of claim 10, wherein the supply monitoring circuit operates to determine whether the power management reset circuit is active.

12. The circuit of claim 11, wherein the power management reset circuit is active when the power management reset circuit is not in a stand-by mode operation.

13. The circuit of claim 11, wherein the supply monitoring circuit determines whether the power management reset circuit is active based on power supply voltage provided to the power management reset circuit.

14. The circuit of claim 1, wherein the input signal is the voltage from the power supply.

15. The circuit of claim 14, wherein power supply to the power management reset circuit is stopped to save power in a stand-by mode of operation and wherein power supply to the flip-flop and shutdown circuit is not stopped during the stand-by mode of operation.

16. The circuit of claim 1, wherein the power management reset circuit is further configured to generate the reset signal in response to monitoring of the voltage of the power supply.

* * * * *